United States Patent
Eisert et al.

(10) Patent No.: US 8,604,497 B2
(45) Date of Patent: Dec. 10, 2013

(54) RADIATION-EMITTING THIN-FILM SEMICONDUCTOR CHIP

(75) Inventors: Dominik Eisert, Regensburg (DE); Berthold Hahn, Hemau (DE); Volker Härle, Laaber (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 556 days.

(21) Appl. No.: 10/572,655

(22) PCT Filed: Sep. 26, 2003

(86) PCT No.: PCT/DE03/03222
§ 371 (c)(1),
(2), (4) Date: Mar. 6, 2007

(87) PCT Pub. No.: WO2005/041313
PCT Pub. Date: May 6, 2005

(65) Prior Publication Data
US 2008/0035941 A1     Feb. 14, 2008

(51) Int. Cl.
*H01L 33/00*    (2010.01)
(52) U.S. Cl.
USPC .......... 257/98; 257/91; 257/88; 257/100; 257/E33.06; 257/E33.006; 438/22; 438/39; 438/455; 438/940
(58) Field of Classification Search
USPC ............ 257/98, 91, 88, 100; 438/22, 39, 455, 438/940, 23
See application file for complete search history.

(56) References Cited

U.S. PATENT DOCUMENTS

| | | |
|---|---|---|
| 5,200,668 A | 4/1993 | Ohashi et al. |
| 5,633,527 A | 5/1997 | Lear |
| 5,779,924 A | 7/1998 | Krames et al. |
| 5,792,698 A | 8/1998 | Nishitani |
| 6,091,085 A | 7/2000 | Lester |
| 6,111,272 A | 8/2000 | Heinen |
| 6,229,160 B1 | 5/2001 | Krames et al. |
| 6,258,618 B1 | 7/2001 | Lester |

(Continued)

FOREIGN PATENT DOCUMENTS

| | | |
|---|---|---|
| DE | 198 07 758 A1 | 12/1998 |
| DE | 199 11 717 A1 | 9/2000 |

(Continued)

OTHER PUBLICATIONS

J. Cao et al., "Improved quality GaN by growth on compliant silicon-on-insulator substrates using metalorganic chemical vapor deposition", Journal of Applied Physics, vol. 83, No. 7, pp. 3829-3834, Apr. 1, 1998.

(Continued)

*Primary Examiner* — Cathy N Lam
(74) *Attorney, Agent, or Firm* — Cozen O'Connor

(57) ABSTRACT

A radiation-emitting thin-film semiconductor chip with an epitaxial multilayer structure (12), which contains an active, radiation-generating layer (14) and has a first main face (16) and a second main face (18)—remote from the first main face—for coupling out the radiation generated in the active, radiation-generating layer. Furthermore, the first main face (16) of the multilayer structure (12) is coupled to a reflective layer or interface, and the region (22) of the multilayer structure that adjoins the second main face (18) of the multilayer structure is patterned one- or two-dimensionally with convex elevations (26).

24 Claims, 6 Drawing Sheets

(56) References Cited

U.S. PATENT DOCUMENTS

| | | | |
|---|---|---|---|
| 6,291,839 B1* | 9/2001 | Lester | 257/91 |
| 6,346,771 B1 | 2/2002 | Salam | |
| 6,410,942 B1 | 6/2002 | Thibeault et al. | |
| 6,445,010 B1 | 9/2002 | Ebeling | |
| 6,515,310 B2* | 2/2003 | Yamazaki et al. | 257/98 |
| 6,649,939 B1 | 11/2003 | Wirth | |
| 6,693,021 B1 | 2/2004 | Motoki et al. | |
| 6,730,939 B2 | 5/2004 | Eisert et al. | |
| 6,878,563 B2 | 4/2005 | Bader et al. | |
| 7,064,355 B2 | 6/2006 | Camras et al. | |
| 7,294,866 B2 | 11/2007 | Liu | |
| 2002/0017652 A1 | 2/2002 | Wirth et al. | |
| 2002/0134986 A1 | 9/2002 | Kamemura et al. | |
| 2003/0127654 A1 | 7/2003 | Eisert et al. | |
| 2003/0141496 A1 | 7/2003 | Wirth et al. | |
| 2003/0151361 A1 | 8/2003 | Ishizaka | |
| 2003/0178626 A1 | 9/2003 | Sugiyama et al. | |
| 2004/0026709 A1 | 2/2004 | Bader et al. | |
| 2004/0033638 A1 | 2/2004 | Bader et al. | |
| 2004/0046179 A1* | 3/2004 | Baur et al. | 257/98 |
| 2004/0051106 A1 | 3/2004 | Baur et al. | |
| 2006/0097271 A1 | 5/2006 | Eisert et al. | |

FOREIGN PATENT DOCUMENTS

| | | |
|---|---|---|
| DE | 199 43 406 A1 | 4/2001 |
| DE | 100 06 738 A1 | 9/2001 |
| DE | 100 20 464 A | 11/2001 |
| DE | 100 26 255 A1 | 11/2001 |
| DE | 100 51 465 A1 | 5/2002 |
| DE | 101 11 501 A1 | 9/2002 |
| EP | 0 905 797 A2 | 8/1998 |
| EP | 1 263 058 A2 | 5/2002 |
| EP | 1 271 665 A | 1/2003 |
| EP | 1 471 583 | 10/2004 |
| JP | 8-102549 | 4/1996 |
| JP | 08-288543 A | 11/1996 |
| JP | 10-4209 | 1/1998 |
| JP | 10-163525 | 6/1998 |
| JP | 11-068153 | 3/1999 |
| JP | 11-274568 | 10/1999 |
| JP | 2000-91639 | 3/2000 |
| JP | 2000174339 | 6/2000 |
| JP | 2000-196152 | 7/2000 |
| JP | 2001-168387 | 6/2001 |
| JP | 2002-185037 | 6/2002 |
| JP | 2003-174195 | 6/2003 |
| JP | 2003-234509 | 8/2003 |
| WO | WO 90/05998 | 5/1990 |
| WO | WO 96/26550 | 8/1996 |
| WO | WO 96/37000 | 11/1996 |
| WO | WO 99/14797 | 3/1999 |
| WO | WO 00/60648 | 10/2000 |
| WO | WO 01/41225 A2 | 6/2001 |
| WO | WO 01/61765 A1 | 8/2001 |
| WO | WO 02/41406 A1 | 5/2002 |
| WO | WO 02/056390 | 7/2002 |
| WO | WO 03/065464 | 8/2003 |
| WO | WO 2004/017430 | 2/2004 |

OTHER PUBLICATIONS

R. Windisch et al., "High-Efficiency Surface-Textured LEDs", Compound Semiconductor, vol. 6, No. 4, pp. 55-58, May/Jun. 2000.

Y.K. Song et al., "Resonant-cavity InGaN quantum-well blue light-emitting diodes", Applied Physics Letters, vol. 77, No. 12, pp. 1744-1746, Sep. 18, 2000.

A.J. Steckl et al., "Growth and Characterization of GaN Thin Films on SiC SOI Substrates", Journal of Electronics Materials, vol. 26, No. 3, pp. 217-223, 1997.

W.S. Wong et al., "Integration of GaN Thin Films with Dissimilar Substrate Materials by Pd-In Metal Bonding and Laser Lift-Off", Journal of Electronic Materials, vol. 28, No. 12, pp. 1409-1413, 1999.

I. Schnitzer et al., "30%, external quantum efficiency from surface textured, thin-film light-emitting diodes", Applied Physics Letter, vol. 63, No. 18, pp. 2174-2176, Oct. 18, 1993.

David S. Ginley et al., "Transparent Conducting Oxides", MRS Bulletin, vol. 25(8), Aug. 2000, pp. 15-21.

* cited by examiner

→■→ planar top side
→♦→ textured top side

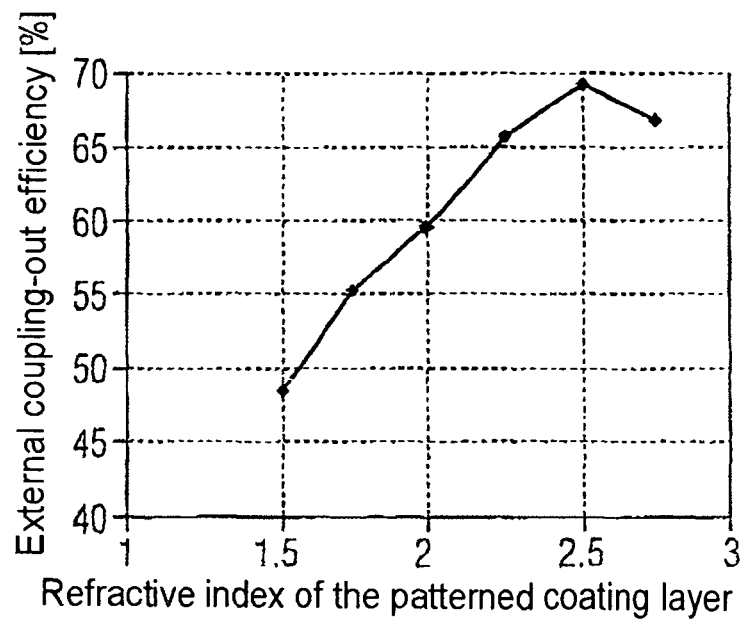
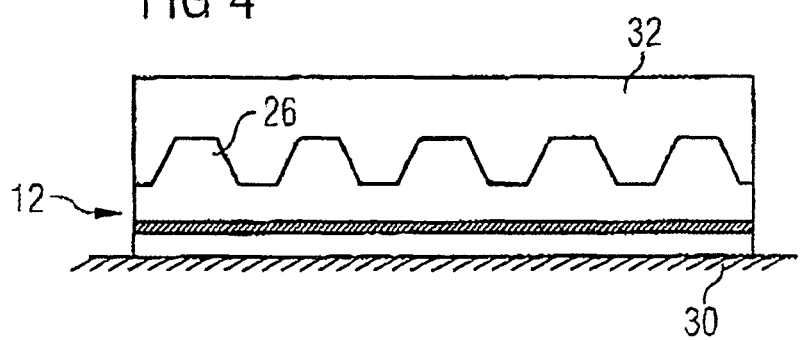

RADIATION-EMITTING THIN-FILM SEMICONDUCTOR CHIP

RELATED APPLICATIONS

This is a U.S. national stage of application No. PCT/DE2003/003222, filed on 26 Sep. 2003.

FIELD OF THE INVENTION

The present invention relates to a radiation-emitting thin-film semiconductor chip with an epitaxial multilayer structure, which contains an active, radiation-generating layer and has a first main face and a second main face, remote from the first main face, for coupling out the radiation generated in the active, radiation-generating layer.

BACKGROUND OF THE INVENTION

A radiation-emitting thin-film semiconductor chip is distinguished preferably by one or a plurality, particularly preferably all, of the following characteristic features:
  a reflective layer is applied or formed at a first main face of a radiation-generating epitaxial layer sequence that faces toward a carrier element, said reflective layer reflecting at least a part of the electromagnetic radiation generated in the epitaxial layer sequence back into the latter;
  the epitaxial layer sequence has a thickness in the region of 20 μm or less, in particular in the region of 10 μm;
  the epitaxial layer sequence contains at least one semiconductor layer with at least one face having an intermixing structure which ideally leads to an approximately ergodic distribution of the light in the epitaxial layer sequence, that is to say it has an as far as possible ergodically stochastic scattering behavior;
  the epitaxial layer sequence is firstly grown onto a growth substrate, the epitaxial layer sequence subsequently being stripped from the growth substrate and fixed on the carrier element.

A basic principle of a thin-film light-emitting diode chip is described for example in I. Schnitzer et al., Appl. Phys. Lett. 63 (16), Oct. 18, 1993, 2174-2176, the disclosure content of which is in this respect hereby incorporated by reference.

A thin-film light-emitting diode chip is to a good approximation a Lambert surface radiator and is therefore particularly well suited to the application in a headlight.

Conventional radiation-emitting semiconductor chips often have a rectangular geometry for reasons of production technology. The semiconductor chips generally comprise a multilayer structure with an active, radiation-generating layer, said multilayer structure being deposited epitaxially on a carrier substrate. The carrier substrate is preferably electrically conductive in order to enable a vertical current flow. Moreover, it is expedient in many cases if the carrier substrate is transparent to the radiation generated in the active layer of the multi-layer structure. However, a high transparency is often at odds with a high electrical conductivity of the material for the carrier substrate. Thus, by way of example, sapphire used for GaN-based light-emitting diodes is transparent to blue light but is not electrically conductive. By contrast, although silicon carbide as carrier substrate for GaN light-emitting diodes is conductive and transparent, the transparency decreases as the conductivity increases, with the result that the properties of the semiconductor chip are not ideal in this case either.

GaN-based semiconductor chips generally serve predominantly for generating radiation in the blue-green spectral range and have a plurality of layers comprising a GaN-based material. In the context of this invention, GaN-based material is understood to mean not only GaN itself but also materials derived from GaN or related to GaN and also ternary or quaternary mixed crystals based thereon. In other words, "GaN-based" means in this connection that a component or part of a component designated in this way preferably contains $Al_nGa_mIn_{1-n-m}N$, where $0 \le n \le 1$, $0 \le m \le 1$ and $n+m \le 1$. In this case, this material need not necessarily have a mathematically exact composition according to the above formula. Rather, it may have one or more dopants and also additional constituents which essentially do not change the physical properties of the material. For the sake of simplicity, however, the above formula only comprises the essential constituents of the crystal lattice (Al, Ga, In, N), even though these may be replaced in part by small quantities of further substances. In particular, these materials include GaN, AlN, InN, $Al_{1-x}Ga_xN$, $In_{1-x}Ga_xN$, $In_{1-x}Al_xN$ and $Al_{1-x-y}In_xGa_yN$ where $0<x<1$, $0<y<1$ and $x+y \le 1$.

Therefore, one possibility for reducing the absorption losses and thus for increasing the external efficiency is the removal of the carrier substrate in conjunction with suitable mirror layers (thin-film concept). However, a semiconductor thin film is essentially a plane-parallel plate whose coupling-out efficiency is not increased compared with a standard diode on account of the geometry. Particularly if a carrier substrate exhibiting only little absorption (for example GaN on SiC) has already been used for the semiconductor chip, the increase in the external efficiency of the thin-film semiconductor chip is too small to justify the increased technical outlay for removing the carrier substrate.

In order to elucidate the problem area of coupling out radiation, FIG. 8 schematically shows a semiconductor chip with the cones of coupling out radiation. Radiation can be coupled out of the semiconductor chip only from a cone with an aperture angle of $\theta = \sin^{-1}(n_{ext}/n_{int})$, where $n_{int}$ denotes the refractive index of the semiconductor material and $n_{ext}$ denotes the refractive index of the surroundings. For a GaN semiconductor ($n_{int}=2.5$), the coupling-out angle θ is 23° with respect to air ($n_{ext}=1$) and 37° with respect to a plastic encapsulation ($n_{ext}=1.5$). Radiation that is generated in the semiconductor chip and does not impinge on the interfaces within a cone is finally reabsorbed and converted into heat. Although the coupling-out cone is large for GaN systems in comparison with GaAs systems ($n_{int}=3.5$), it nevertheless leads to undesirably high radiation losses.

These conditions also do not change significantly with altered layer thicknesses. However, the thin-film geometry is expedient for the beam coupled out via the top side since the absorption is low on account of the short path in the semiconductor. For the beam coupled out laterally, by contrast, the efficiency may even be lower on account of the multiple reflections in the semiconductor.

Therefore, there are already various approaches for increasing the external efficiency of semiconductor chips through altered geometries. Mention shall be made here, in particular, of a so-called micropatterning of the entire multilayer structure, which leads to an intensified lateral coupling out of radiation on account of the larger total area of the side faces of the multilayer structure. In addition, the side faces of the individual multilayer structures thus produced may be beveled. Examples of such semiconductor chips are disclosed in DE-A-198 07 758, EP-A-0 905 797 or JP-A-08-288543.

A further possibility for increasing the coupling out of radiation is shown in FIGS. 3 and 5 of DE-A-199 11 717.

Here, the multilayer structure with the active, radiation-generating layer is assigned individual radiation coupling-out elements in the form of sphere segments or truncated cones formed for example by means of corresponding etching of grown layers.

SUMMARY OF THE INVENTION

One object of the present invention is to provide a radiation-emitting thin-film semiconductor chip, in particular based on GaN, which has an improved external efficiency of coupling out radiation.

This and other objects are attained in accordance with one aspect of the present invention directed to a radiation-emitting thin-film semiconductor chip with a multilayer structure, which contains an active, radiation-generating layer and has a first main face and a second main face—remote from the first main face—for coupling out the radiation generated in the active, radiation-generating layer. The first main face of the multilayer structure is coupled to a reflective layer or interface, and the region of the multilayer structure that adjoins the second main face of the multilayer structure is patterned one- or two-dimensionally.

The multilayer structure preferably contains a GaN-based material. For the multilayer structure it is also possible, however, to use other compound semiconductors from the III-V semiconductor material system, such as phosphide or arsenide compound semiconductors (that is to say $Al_aGa_bIn_{1-a-b}P$ or $Al_aGa_bIn_{1-a-b}As$, where $0 \leq a \leq 1$, $0 \leq b \leq 1$ and $a+b \leq 1$), or from the II-VI semiconductor material system.

The increase in the external efficiency of coupling out radiation is based on breaking the right-angled geometry of the thin-film semiconductor chip by patterning the semiconductor thin film itself. The increase in efficiency is verified with the aid of examination results in the context of the detailed description below.

Preferably, the patterned region of the multilayer structure that adjoins the second main face of the multilayer structure has convex elevations in the form of truncated pyramids, truncated cones, cones or sphere segments (two-dimensional patterning) or with a trapezoidal, triangular or circle segment cross-sectional form (one-dimensional patterning).

In a preferred exemplary embodiment, the inclination angle of the elevations lies between approximately 30° and approximately 70°, particularly preferably between approximately 40° and approximately 50°. The inclination angle is the angle formed between a side face of the elevation and the perpendicular to the main plane of extent of the multilayer structure. Moreover, the height of the elevations is at least as large, preferably approximately twice as large, as the distance between the patterned region and the active, radiation-generating layer. The cell size of an elevation, that is to say the lateral dimension of an elevation, is measured from the center of an elevation to the center of an adjacent elevation if the elevations are arranged closely directly next to one another. The cell size of the elevations is chosen to be at most approximately five times, preferably at most approximately three times, as large as the height of the elevations.

The layer or interface coupled to the first main face of the multilayer structure advantageously has a reflectivity of at least 70%, and better of at least 85%.

The multilayer structure may be applied on a carrier substrate either directly by its first main face or via a reflective layer, the reflective layer or the carrier substrate simultaneously serving as an electrical contact layer of the semiconductor chip.

As compensation of a limited transverse conductivity of the thin semiconductor layer, an electrically conductive, transparent layer may be applied on the second main face of the multilayer structure.

In order to afford protection against external influences, a transparent protective or coating layer may be applied on the second main face of the multilayer structure.

Another aspect of the present invention is directed to a radiation-emitting thin-film semiconductor chip according to the invention likewise has a multilayer structure, which contains an active, radiation-generating layer and has a first main face and a second main face—remote from the first main face—for coupling out the radiation generated in the active, radiation-generating layer. The first main face of the multilayer structure is once again coupled to a reflective layer or interface. In contrast to the semiconductor chip described above, here a transparent layer is provided between the first main face of the multilayer structure and the reflective layer or interface, said transparent layer being patterned one- or two-dimensionally.

The patterning of this transparent layer between the multilayer structure and the reflective layer or interface has the effect, like the patterning of the multilayer structure itself, of increasing the external efficiency of coupling out radiation.

The transparent layer is preferably conductive in order to compensate for the limited transverse conductivity of a thin multilayer structure.

The transparent layer between the first main area of the multilayer structure and the reflective layer or interface has convex elevations preferably in the form of truncated pyramids or truncated cones (two-dimensional patterning) or a trapezoidal cross-sectional form (one-dimensional patterning).

In a preferred embodiment, said elevations have an inclination angle of between approximately 30° and approximately 70°, preferably between approximately 40° and approximately 50°. The inclination angle is the angle formed between a side face of the elevation and the perpendicular to the main plane of extent of the multilayer structure. In this case, the height of the elevations is chosen to be at least as large, preferably approximately twice as large, as the height of a non-patterned region of the multilayer structure between the active, radiation-generating layer and the elevations$_{[PP1]}$, and the cell size of the elevations is at most five times, preferably at most three times, the height of the elevations.

The layer or interface coupled to the first main face of the multilayer structure preferably has a reflectivity of at least 70%, particularly preferably of at least 85%.

The reflective layer may be applied on a carrier substrate or the reflective interface is formed by a carrier substrate, the reflective layer or the carrier substrate simultaneously serving as a contact layer of the semiconductor chip.

Another aspect of the invention is directed to a radiation-emitting thin-film semiconductor chip with an epitaxial multilayer structure, which contains an active, radiation-generating layer and has a first main face and a second main face, remote from the first main face, for coupling out the radiation generated in the active, radiation-generating layer, wherein the first main face of the multilayer structure is coupled to a reflective layer or interface, and a one- or two-dimensionally patterned coating layer is arranged on the second main face of the multilayer structure.

BRIEF DESCRIPTION OF THE DRAWINGS

The above and further features and advantages of the present invention are described in more detail on the basis of the following detailed description of various preferred exemplary embodiments with reference to the accompanying drawings, in which:

FIGS. 3A to 3E show results of various examinations for elucidating various optimal parameters of the elevations of the semiconductor chip from FIG. 1;

FIG. 4 shows a schematic illustration of a modification of the first exemplary embodiment from FIG. 1;

DETAILED DESCRIPTION OF THE DRAWINGS

Figure 1:
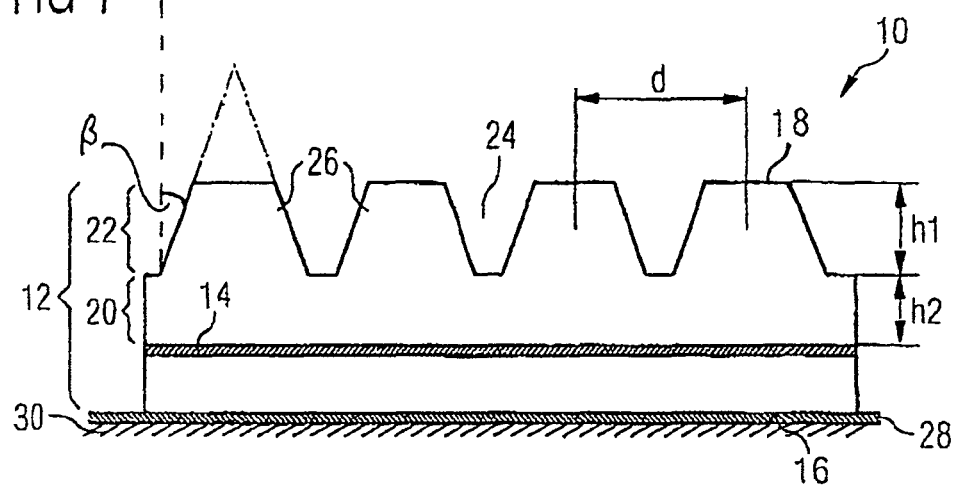
FIG. 1 shows a schematic illustration of a first exemplary embodiment of a semiconductor chip according to the present invention in section.

FIG. 1 illustrates a first preferred exemplary embodiment of a thin-film semiconductor chip according to the present invention. A main constituent part of the semiconductor chip 10 is a multilayer structure 12, preferably based on GaN, which contains an active, radiation-generating layer 14. The multilayer structure 12 is grown epitaxially in a customary manner and contains here, in a known manner, a plurality of GaN-based layers.

The multilayer structure 12 has a first main face 16 and a second main face 18 remote from the first main face, the radiation generated in the active, radiation-generating layer 14 finally being coupled out of the semiconductor chip 10 through the second main face 18. In the exemplary embodiment shown, the active layer 14 is positioned nearer to the first main face 16 than to the second main face 18 of the multilayer structure 12. However, the present invention is in no way restricted to this. Rather the active layer 14 may also be formed centrally in the multilayer structure 12 or nearer to the second main face 18. The position chosen in FIG. 1 is advantageous, however, for the patterning of the multilayer structure that is in accordance with the invention and is described below, since a thicker portion of the multilayer structure 12 is available for the patterning.

The multilayer structure 12 is applied via a reflective layer 28, preferably comprising an electrically conductive material, on a carrier substrate 30 made, for example, of sapphire, Si or SiC. The reflective layer 28 may be formed for example as a metallic contact layer made of Ag, Al or an Ag or Al alloy or alternatively as dielectric mirror-coating comprising a plurality of dielectric layers. In an alternative embodiment, the multilayer structure 12 may also be applied directly on the carrier substrate 30, in this case the material of the carrier substrate 30 being selected in such a way that the interface between multilayer structure 12 and carrier substrate 30 is reflective.

As is clearly discernable in FIG. 1, the region of the multilayer structure 12 above the active layer 14 can be subdivided essentially into a non-patterned region 20 adjoining the active layer 14 and a patterned region 22 adjoining the second main face 18. The multilayer structure 12 is patterned for example by means of customary lithography and/or etching methods at the epitaxially grown semiconductor layers, by means of which groovelike recesses or depressions 24 are formed, between which corresponding elevations 26 remain.

The patterning of the multilayer structure 12 may be formed to extend either in one direction, that is to say with depressions 24 running in only one coordinate direction of the plane of the second main face 18, such patterning being referred to as one-dimensional patterning, or in two directions, that is to say with depressions 24 running in two coordinate directions, preferably perpendicular to one another, of the plane of the second main face 18 such patterning being referred to as two-dimensional patterning. The elevations 26 produced between the depressions 24 are preferably shaped in convex fashion. In this case, one-dimensional patternings are formed by way of example with a trapezoidal (see FIG. 1), triangular, circle segment or hemispherical cross-sectional form and two-dimensional patternings are correspondingly formed in the form of truncated pyramids, truncated cones, cones, sphere segments or hemispheres.

FIG. 1 illustrates elevations 26 in the form of truncated pyramids. As shown in FIG. 1, a side face of the elevation 26 forms an inclination angle β with the perpendicular to the main plane of extent of the multilayer structure. This definition can also be applied correspondingly to the other forms of the elevations 26. On account of the convexly shaped elevations 26, the radiation generated in the active layer 14 is possibly reflected multiply at the interfaces of the multilayer structure 12 until the radiation finally impinges, in the radiation coupling-out cone dependent on the refractive indices of the materials and the surroundings, on the second main face 18 or the bottom of the depressions 24 and can thus couple out.

Figure 2A:
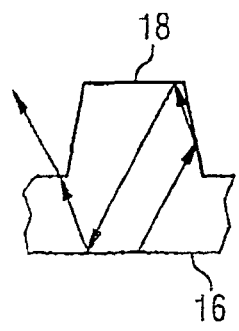
FIGS. 2A to 2C show schematic illustrations for elucidating the optimum inclination angle of the elevations of the semiconductor chip from FIG. 1.
Figure 2B:
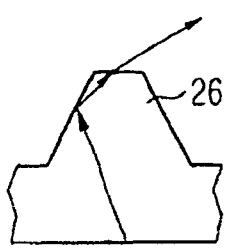
Figure 2C:

As illustrated in FIGS. 2A to 2C, the efficiency of coupling out radiation depends on the inclination angle β of the elevations 26. Very steep sidewalls, as in FIG. 2A, increase the surface area of the device and are thus expedient for coupling out radiation, but they are at best only marginally associated with a reduction of the number of modes that cannot be coupled out on account of total reflection. Likewise, the sidewalls of the elevations 26 should not be chosen to be too shallow, as illustrated in FIG. 2C, since in this case the deviation from the plane-parallel plate is only small and a large number of multiple reflections have to be effected before coupling out, which is negative on account of the unavoidable attenuation in this case.

A medium angular range of the inclination angle β of the elevations 26 as illustrated in FIG. 2B is the most expedient. With this choice of the inclination angle β, the radiation that undergoes total reflection from one facet of the elevation 26 can be coupled out within the radiation coupling-out cone upon impinging on the next facet of the elevation 26, thereby keeping down the number of multiple reflections in the multilayer structure.

Figure 3A:
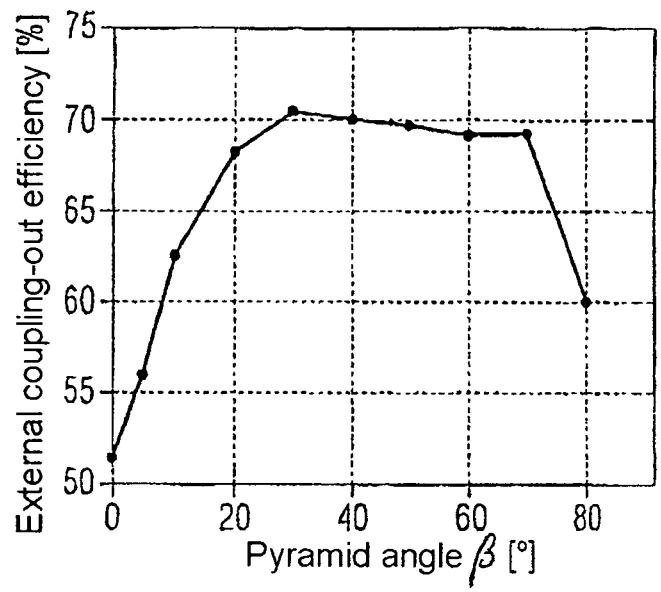

This estimation is also confirmed by examinations, the results of which are shown in FIG. 3A. In this case, the inclination angle β of the elevations 26 in truncated pyramid form is plotted on the abscissa, and the external efficiency of coupling out radiation is plotted on the ordinate. It is clearly evident that the best efficiency is achieved in a range of the inclination angle β between approximately 30° and approximately 70°, more precisely between approximately 40° and approximately 50°. The efficiency of coupling out radiation falls significantly for values of the inclination angle β above 70° and below 30°. An inclination angle β in the range around approximately 45° is thus preferable.

A further parameter that influences the external efficiency of coupling out radiation is the height h1 of the elevations 26. In order to obtain a high efficiency, the height h1 of the elevations 26 should be chosen to be at least as large as the height h2 of the non-patterned region 20 adjoining the active layer 14. Preferably, the elevations 26 are formed twice as high as the non-patterned region 20; a further increase in the height of the elevations 26 does not yield any (or yields only a slight) further increase in the coupling out of radiation.

Figure 3B:
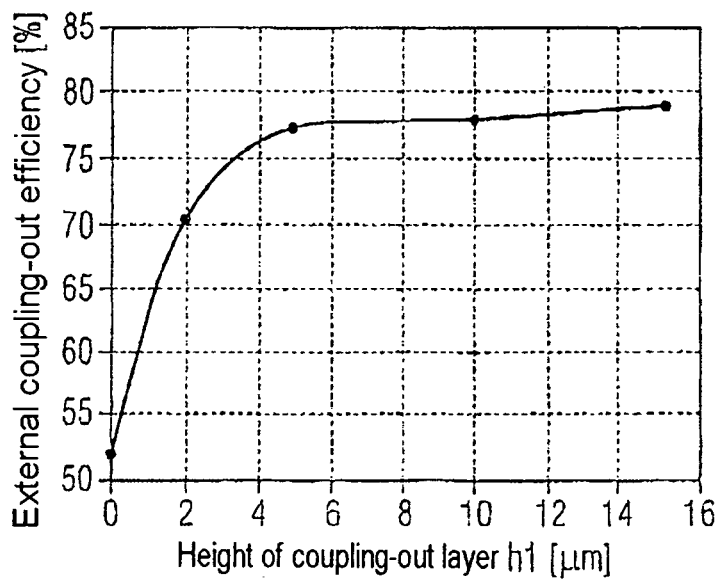

This is confirmed by examination results illustrated in FIG. 3B. The examination results show, for a non-patterned region 20 having a height h2 of approximately 2 µm, the external efficiency of coupling out radiation against the height h1 of the elevations 26. At a height h1 of the elevations 26 below 2 µm, i.e. smaller than the height h2 of the non-patterned region 20, radiation is coupled out only inadequately, while a significant increase in the efficiency is no longer discernable at heights h1 of the elevations 26 greater than approximately 4 µm.

Figure 3C:
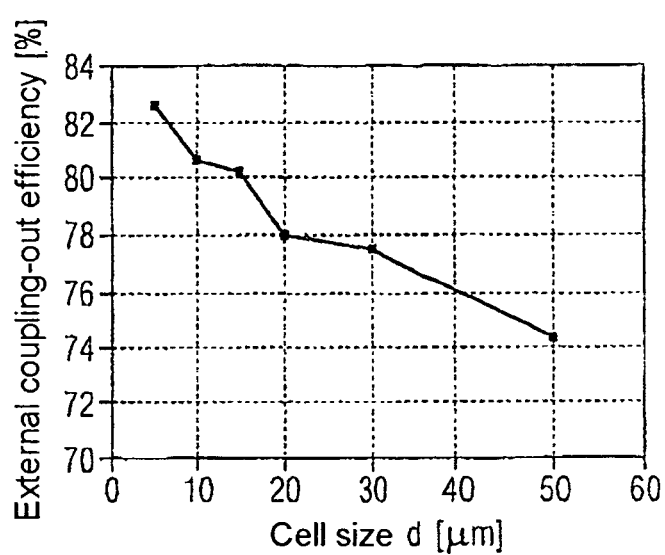

Furthermore, elevations 26 having relatively small lateral dimensions are also preferable. As shown by the examination results of FIG. 3C), a cell size d of the elevations of at most approximately four to five times the height h1 of the elevations 26, preferably only of approximately one to three times the height h1 of the elevations, is advantageous for a good efficiency.

Figure 3D:
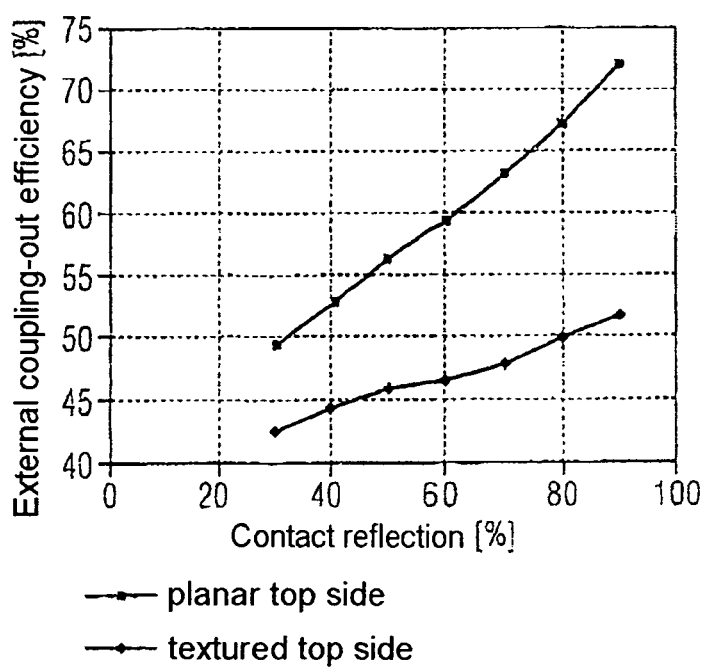

Since the concept of the thin-film semiconductor chips is also based on multiple reflections, inter alia, the reflectivity of the rear side of the device, that is to say of the reflective layer 28 or of the reflective interface, likewise influences the external efficiency of the semiconductor chip. It is evident in the diagram of FIG. 3D that, in the case of a conventional planar thin film, the efficiency of coupling out radiation depends only to a small extent on the reflectivity of the rear-side contact layer (lower curve in FIG. 3D). For a patterned multilayer structure 12 as in FIG. 1, however, the efficiency greatly depends on the reflectivity of the reflective layer 28 or interface (upper curve in FIG. 3D) and should be chosen as far as possible to be above 70%, preferably above 85%.

FIG. 4 illustrates a modification of the semiconductor chip from FIG. 1. The difference between the two embodiments is that a protective or coating layer 32 is provided on the patterned second main face 18 of the multilayer structure 12. Said protective layer 32 is intended to protect the semiconductor from external influences, on the one hand, and the protective layer 32 may, on the other hand, act as an antireflective coating given a suitable choice of refractive index and thickness.

As a further variant of the first exemplary embodiment of the semiconductor chip, a transparent, conductive layer with the lowest possible contact resistance with respect to the semiconductor may be provided on the patterned second main face 18 of the multilayer structure 12. Such a transparent, conductive layer makes it possible to compensate for the disadvantage that the patterning of the multilayer structure for increasing the efficiency of coupling out radiation at the same time reduces its transverse conductivity. An optimum current supply to all regions of the semiconductor chip is obtained without impairing the coupling-out of radiation from the multilayer structure by metal contacts on the latter. This variant corresponds closely to the embodiment shown in FIG. 4.

The transparent, conductive layer comprises, by way of example, ZnO, SnO, InO, CdO, GaO or a combination thereof. These materials exhibit an n-type or p-type conductivity and can be deposited by means of sputtering methods, CVD methods or vapor deposition.

Figure 5:
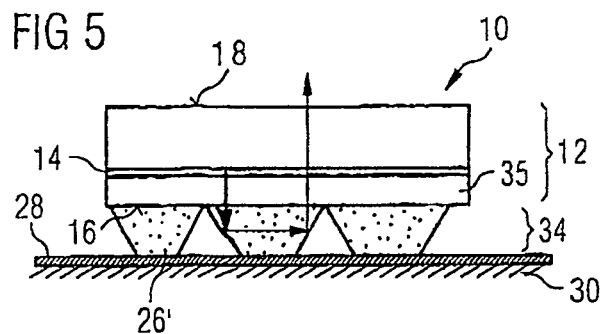
FIG. 5 shows a schematic illustration of a second exemplary embodiment of a semiconductor chip according to the present invention in section.

A second exemplary embodiment of a radiation-emitting semiconductor chip according to the invention is illustrated in FIG. 5.

The thin-film semiconductor chip 10 has a multilayer structure 12 preferably based on GaN with an active, radiation-generating layer 14. In contrast to the first exemplary embodiment described above, however, the second main face 18 of the multilayer structure 12, through which the radiation generated in the active layer 14 is finally coupled out, is not patterned here. Rather a transparent layer 34 is provided between the first main face 16 and the reflective layer or interface on the carrier substrate 30, said transparent layer being patterned in order to increase the coupling out of radiation. This construction is preferable particularly when the metals that make good contact with the semiconductor 12 are not particularly highly reflective and, therefore, metals that reflect better, such as Ag, are intended to be used, which may contaminate the semiconductor on account of high migration.

In order to compensate for a lower transverse conductivity of the thin-film semiconductor, it is advantageous for the transparent layer 34 to be formed from a conductive material.

The patterning essentially corresponds to that described above on the basis of the first exemplary embodiment. However, the convex elevations 26' that are appropriate here are primarily those in the form of truncated pyramids or truncated cones or those with a trapezoidal cross-sectional form. The patterning parameters explained above with reference to FIG. 3 can be applied to the elevations 26' of this second exemplary embodiment. In this case, the non-patterned layer 35 between the active layer 14 of the multilayer structure 12 and the transparent layer 34 is to be used as reference variable.

Figure 6:
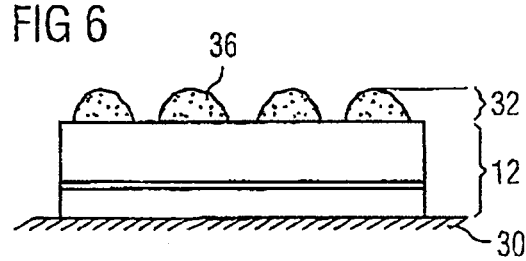
FIG. 6 shows a schematic illustration of a further modification of the first exemplary embodiment from FIG. 1.

A further alternative embodiment of the semiconductor chip of FIG. 1 is shown in FIG. 6. In the case of this semiconductor chip 10, the multilayer structure 12 itself is not patterned, rather a coating layer 32 applied on the second main area 18 of the multilayer structure 12 is provided with corresponding convex elevations 36.

Typical coating layers 32, for example made of $SiO_2$ or $SiN_x$, have a refractive index of less than 2, with the result that the radiation partly undergoes total reflection at the interface between semiconductor 12 and coating layer 32. As shown in the diagram of FIG. 3E, the effectiveness of the patterned coating layer 32 decreases significantly as the refractive index deviates increasingly from that of the semiconductor with 2.5. A patterned antireflection layer having a low refractive index may nevertheless be advantageous, however, since even a wave subjected to total reflection penetrates the material having a lower refractive index approximately to a depth of half the wavelength, although it decays exponentially in this case. The height of the patterned antireflection layer should therefore be no more than a few 100 nm and the lateral dimensions are in the micrometers range.

If the lateral dimensions of the structures 36 of the coating layer 32 are reduced to the range of the wavelength of the radiation to be coupled out, an impinging wave is scattered at such a microstructure 36, as a result of which the beam is fanned out into a larger angular range.

Figure 7:
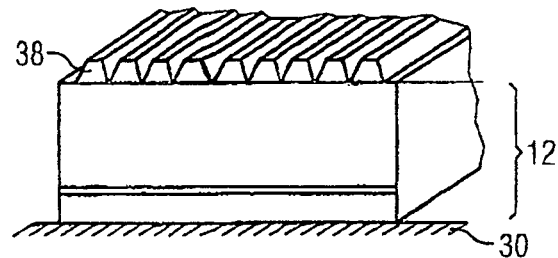
FIG. 7 shows a schematic illustration of yet another modification of the first exemplary embodiment from FIG. 1.
Figure 8:
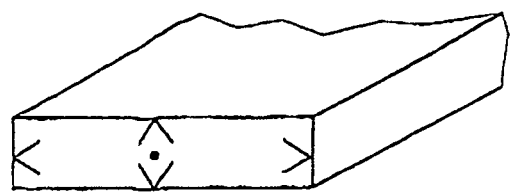
FIG. 8 shows a highly diagrammatic illustration with regard to coupling out radiation from conventional semiconductor chips.
Figure 9A:
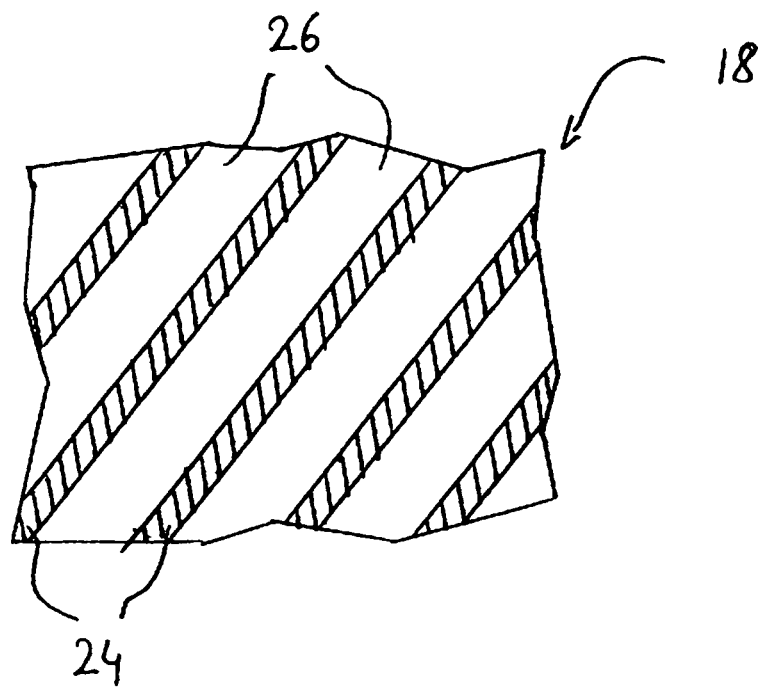
FIG. 9A shows a plan view of a semiconductor chip with one-dimensional patterning.
Figure 9B:
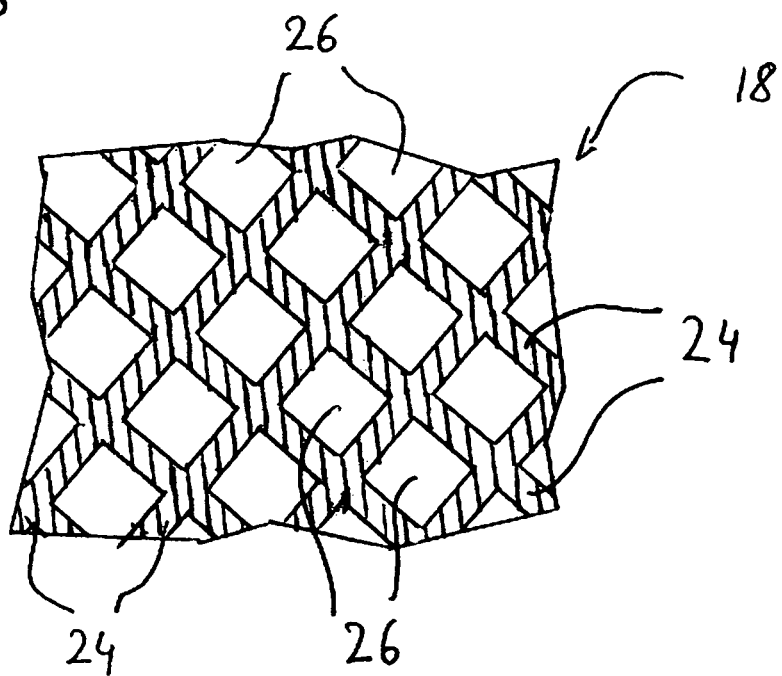
FIG. 9B shows a plan view of a semiconductor chip with two-dimensional patterning.

Finally, FIG. 7 shows a further modification of the semiconductor chip from FIG. 1. A transparent, conductive layer 38 made, for example, of ZnO, SnO, InO, CdO, GaO or a combination thereof is applied on the multilayer structure 12, which is not patterned in this case. Said transparent, conductive layer 38 is patterned analogously to the first exemplary embodiment from FIG. 1, FIG. 7 illustrating a one-dimensional patterning with elevations with a trapezoidal cross-sectional form.

The contact resistance between the transparent, conductive layer 38 and the semiconductor 12 should be as low as possible. If this is not the case, a metal layer (not illustrated) may be required between the layer 38 and the multilayer structure 12, said metal layer preferably being formed such that it is very thin and thus semitransparent or interrupted.

The scope of protection of the invention is not restricted by the description of the invention on the basis of the exemplary embodiments. Rather, the invention encompasses any new feature and also any combination of features, which in particular comprises any combination of features in the patent claims, even if this combination is not explicitly specified in the patent claims.

The invention claimed is:

1. A radiation-emitting thin-film semiconductor chip comprising an epitaxial multilayer structure, a carrier substrate and a reflective layer or interface, the epitaxial multilayer structure comprising:
    an active, radiation-generating layer,
    a first main face, and
    a second main face remote from the first main face for coupling out the radiation generated in the active, radiation-generating layer,
    wherein the first main face of the multilayer structure is coupled to the reflective layer or interface, and
    wherein a patterned region of the multilayer structure that adjoins the second main face of the multilayer structure is patterned by either one- or two-dimensional depressions forming convex elevations, each said convex elevation having an upper surface that is not contiguous with an upper surface of an adjacent elevation,
    wherein the epitaxial multilayer structure is based on one of an arsenide compound semiconductor material and GaN,
    wherein the depressions of the patterned region are formed in said epitaxially grown semiconductor material of the multilayer structure,
    wherein the reflective layer is located between the carrier substrate and the epitaxial multilayer structure, and
    wherein the reflective layer is formed as a metallic contact layer.

2. The semiconductor chip as claimed in claim 1, wherein the epitaxial multilayer structure of the semiconductor chip is free of a growth substrate.

3. The semiconductor chip as claimed in claim 1, wherein the elevations have a form of truncated pyramids or truncated cones or a trapezoidal cross-sectional form.

4. The semiconductor chip as claimed in claim 1, wherein the elevations have a form of cones or a triangular cross-sectional form.

5. The semiconductor chip as claimed in claim 1, wherein the elevations have an inclination angle ($\beta$) of between approximately 40° and approximately 50°.

6. The semiconductor chip as claimed in claim 1, wherein the elevations have a height ($h1$) at least as large as a distance ($h2$) between the patterned region and the active, radiation-generating layer.

7. The semiconductor chip as claimed in claim 6, wherein the height ($h1$) of the elevations is approximately twice as large as the distance ($h2$) between the patterned region and the active, radiation-generating layer.

8. The semiconductor chip as claimed in claim 1, wherein a cell size (d) of the elevations is at most approximately five times as large as a height ($h1$) of the elevations.

9. The semiconductor chip as claimed in claim 8, wherein the cell size (d) of the elevations is at most approximately three times as large as the height ($h1$) of the elevations.

10. The semiconductor chip as claimed in claim 1, wherein the reflective layer or interface coupled to the first main area of the multilayer structure has a reflectivity of at least 85%.

11. The semiconductor chip as claimed in claim 2, wherein the multilayer structure is applied onto the carrier substrate either directly by the first main face or via the reflective layer or interface.

12. The semiconductor chip as claimed in claim 11, wherein the reflective layer or interface or the carrier substrate serves as a contact layer of the semiconductor chip.

13. The semiconductor chip as claimed in claim 1, further comprising a conductive, transparent layer applied onto the second main face of the multilayer structure.

14. The semiconductor chip as claimed in claim 1, further comprising a transparent protective layer applied onto the second main face of the multilayer structure.

15. The semiconductor chip as claimed in claim 1, wherein the multilayer structure comprises a material or a plurality of different materials based on GaN.

16. The semiconductor chip as claimed in claim 1, wherein the second main face is a noncontinuous layer.

17. The semiconductor chip as claimed in claim 1, wherein the reflective layer is in direct contact with the epitaxial multilayer structure.

18. The semiconductor chip as claimed in claim 1, wherein the epitaxial multilayer structure is based on a II-VI semiconductor material.

19. The semiconductor chip as claimed in claim 1, wherein the epitaxial multilayer structure is based on a phosphide compound semiconductor material.

20. The semiconductor chip as claimed in claim 1, wherein the epitaxial multilayer structure is based on an arsenide compound semiconductor material.

21. The semiconductor chip as claimed in claim 1, wherein the patterned region of the multilayer structure that adjoins the second main face of the multilayer structure is patterned by two-dimensional depressions forming convex elevations.

22. The semiconductor chip as claimed in claim 1, wherein the convex elevations have an inclination angle ($\beta$) of between approximately 30° and approximately 70°.

23. The semiconductor chip as claimed in claim 22, wherein the elevations have an inclination angle ($\beta$) of between approximately 40° and approximately 50°.

24. A radiation-emitting thin-film semiconductor chip comprising an epitaxial multilayer structure, a carrier substrate and a reflective layer or interface, the epitaxial multilayer structure comprising:
    an active, radiation-generating layer,
    a first main face, and
    a second main face remote from the first main face for coupling out the radiation generated in the active, radiation-generating layer,
    wherein the first main face of the multilayer structure is coupled to the reflective layer or interface,
    wherein a patterned region of the multilayer structure that adjoins the second main face of the multilayer structure is patterned by either one- or two-dimensional depressions forming convex elevations, each said convex elevation having an upper surface that is not contiguous with an upper surface of an adjacent elevation,
    wherein the epitaxial multilayer structure is based on one of an arsenide compound semiconductor material and GaN, wherein the depressions of the patterned region are formed in said epitaxially grown semiconductor material of the multilayer structure,
wherein the reflective layer is located between the carrier substrate and the epitaxial multilayer structure,
wherein the reflective layer is formed as a metallic contact layer, and
wherein the carrier substrate comprises sapphire or silicon.

\* \* \* \* \*